(12) United States Patent
Koo et al.

(10) Patent No.: US 8,129,744 B2
(45) Date of Patent: Mar. 6, 2012

(54) LIGHT EMITTING DEVICE

(75) Inventors: Hongmo Koo, Seoul (KR); Daeyang Oh, Seoul (KR)

(73) Assignee: LG Electronics Inc., Seoul (KR)

( * ) Notice: Subject to any disclaimer, the term of this patent is extended or adjusted under 35 U.S.C. 154(b) by 144 days.

(21) Appl. No.: 12/759,502

(22) Filed: Apr. 13, 2010

(65) Prior Publication Data

US 2010/0193832 A1 Aug. 5, 2010

Related U.S. Application Data

(62) Division of application No. 11/987,754, filed on Dec. 4, 2007, now Pat. No. 7,723,747.

(30) Foreign Application Priority Data

Mar. 2, 2007 (KR) .................. 10-2007-0021091

(51) Int. Cl.
*H01L 33/00* (2010.01)

(52) U.S. Cl. ............... 257/100; 257/13; 257/95; 257/98

(58) Field of Classification Search .................... 257/13, 257/95, 98, 100, E33.059
See application file for complete search history.

(56) References Cited

U.S. PATENT DOCUMENTS

| | | | | |
|---|---|---|---|---|
| 4,352,119 A * | 9/1982 | Bardens et al. | ............... | 257/682 |
| 4,426,769 A * | 1/1984 | Grabbe | ............... | 257/682 |
| 5,825,054 A * | 10/1998 | Lee et al. | ............... | 257/98 |
| 6,210,815 B1 * | 4/2001 | Ooishi | ............... | 257/100 |
| 6,679,621 B2 * | 1/2004 | West et al. | ............... | 362/327 |
| 6,800,350 B2 * | 10/2004 | Van Hal et al. | ............... | 257/100 |
| 6,808,828 B2 * | 10/2004 | Ohata | ............... | 257/100 |
| 6,812,503 B2 * | 11/2004 | Lin et al. | ............... | 257/100 |
| 6,858,983 B2 * | 2/2005 | Mochizuki et al. | ............... | 257/98 |
| 6,861,802 B2 | 3/2005 | Hishida | ............... | 313/512 |
| 6,894,316 B2 * | 5/2005 | Yoshii et al. | ............... | 257/100 |
| 6,986,593 B2 | 1/2006 | Rhoads et al. | ............... | 362/308 |
| 6,992,332 B2 | 1/2006 | Yamazaki et al. | ............... | 257/83 |
| 7,042,022 B2 * | 5/2006 | Han et al. | ............... | 257/100 |
| 7,075,114 B2 * | 7/2006 | Abe et al. | ............... | 257/100 |
| 7,081,644 B2 * | 7/2006 | Flaherty et al. | ............... | 257/100 |
| 7,153,000 B2 * | 12/2006 | Park et al. | ............... | 257/100 |
| 7,278,756 B2 * | 10/2007 | Leu et al. | ............... | 257/100 |
| 7,329,560 B2 * | 2/2008 | Gramann et al. | ............... | 438/99 |
| 7,352,011 B2 * | 4/2008 | Smits et al. | ............... | 257/100 |
| 7,378,686 B2 * | 5/2008 | Beeson et al. | ............... | 257/100 |
| 7,497,597 B2 * | 3/2009 | Suehiro et al. | ............... | 257/100 |
| 7,498,610 B2 | 3/2009 | Kim et al. | ............... | 257/99 |
| 7,661,844 B2 * | 2/2010 | Sekiguchi et al. | ............... | 257/100 |
| 7,745,818 B2 * | 6/2010 | Sofue et al. | ............... | 257/100 |
| 7,825,423 B2 * | 11/2010 | Shiraishi et al. | ............... | 257/100 |
| 7,842,960 B2 * | 11/2010 | Reginelli et al. | ............... | 257/100 |
| 2002/0125494 A1 * | 9/2002 | Isokawa | ............... | 257/100 |
| 2002/0155320 A1 * | 10/2002 | Park et al. | ............... | 257/100 |
| 2003/0042848 A1 | 3/2003 | Park et al. | ............... | 313/503 |
| 2003/0091858 A1 * | 5/2003 | Peng | ............... | 257/100 |
| 2003/0098651 A1 * | 5/2003 | Lin et al. | ............... | 257/95 |
| 2004/0140543 A1 * | 7/2004 | Elpedes et al. | ............... | 257/676 |

(Continued)

*Primary Examiner* — Long Tran
*Assistant Examiner* — Jordan Klein
(74) *Attorney, Agent, or Firm* — KED & Associates, LLP

(57) ABSTRACT

A light emitting device is provided that includes a substrate, a light emitting unit formed on the substrate, and an encapsulation unit. The encapsulation unit may include a first region corresponding to the light emitting unit and a second region coalesced with the substrate. The encapsulation unit of the first region or a part of the encapsulation unit of the first region may have a positive curvature.

20 Claims, 7 Drawing Sheets

U.S. PATENT DOCUMENTS

| | | | |
|---|---|---|---|
| 2004/0256630 A1* | 12/2004 | Cao | 257/100 |
| 2005/0014022 A1* | 1/2005 | Park | 257/100 |
| 2005/0093014 A1* | 5/2005 | Seki et al. | 257/100 |
| 2005/0238908 A1* | 10/2005 | Hikmet et al. | 257/100 |
| 2006/0034082 A1* | 2/2006 | Park et al. | 362/268 |
| 2006/0040425 A1* | 2/2006 | Tanabe | 438/108 |
| 2006/0128042 A1 | 6/2006 | Gramann et al. | 438/26 |
| 2006/0169997 A1 | 8/2006 | Suzuki et al. | 257/95 |
| 2006/0197095 A1* | 9/2006 | Nakajima | 257/79 |
| 2006/0284161 A1* | 12/2006 | Tokida | 257/13 |
| 2006/0284209 A1 | 12/2006 | Kim et al. | 257/100 |
| 2007/0228000 A1 | 10/2007 | Kim | 215/230 |
| 2008/0048200 A1* | 2/2008 | Mueller et al. | 257/98 |

* cited by examiner

LIGHT EMITTING DEVICE

The present application is a Divisional Application of U.S. patent application Ser. No. 11/987,754, filed Dec. 4, 2007, now U.S. Pat. No. 7,723,747 which claims priority from Korean Patent Application No. 10-2007-0021091, filed Mar. 2, 2007, the subject matters of which are incorporated herein by reference. The present application claims priority under 35 U.S.C. §120 from U.S. patent application Ser. No. 11/987,754.

BACKGROUND

1. Field

Embodiments of the present invention may relate to displays. More particularly, embodiments of the present invention may relate to a light emitting device.

2. Background

A light emitting device is a self-light emitting device having a low driving voltage and a high emission efficiency that can emit a variety of colors. The light emitting device may be made thin and may have patterns easily formed therein. The light emitting device is a type of flat display device.

The light emitting device may include two electrodes and a light emitting unit having a light emitting layer formed between the two electrodes.

The light emitting device may experience degradation due to moisture, oxygen, ultraviolet rays and so on. The degradation may include external forces applied to the device in a fabrication process of the device or during use.

External moisture and oxygen may oxidize a light emitting unit that includes an organic material, and thus may degrade and damage the light emitting unit. Thus, moisture and oxygen may have a detrimental effect on lifespan of the light emitting device. Accordingly, a sealing structure for encapsulating the light emitting unit may be used. The encapsulation unit or an encapsulation substrate formed of metal, glass, plastic or the like may be connected to a lower substrate using a sealing material, such as a sealant, in order to encapsulate the internal elements.

If external pressure is applied, the light emitting unit may experience degradation and damage due to contact of the light emitting unit and the encapsulation unit or contact of the light emitting unit and a getter.

If the light emitting device is used for a long period of time, a thickness of the getter that absorbs moisture may become thick. Thus, the getter and the light emitting unit may be brought in contact with each other, thereby causing partial degradation and/or damage to the light emitting unit.

If the size of the getter is decreased in order to prevent the problem, the light emitting device may not provide sufficient moisture absorption. Further, if the space between the light emitting unit and the getter is too large, then an overall thickness of the light emitting device may become too thick.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1A:
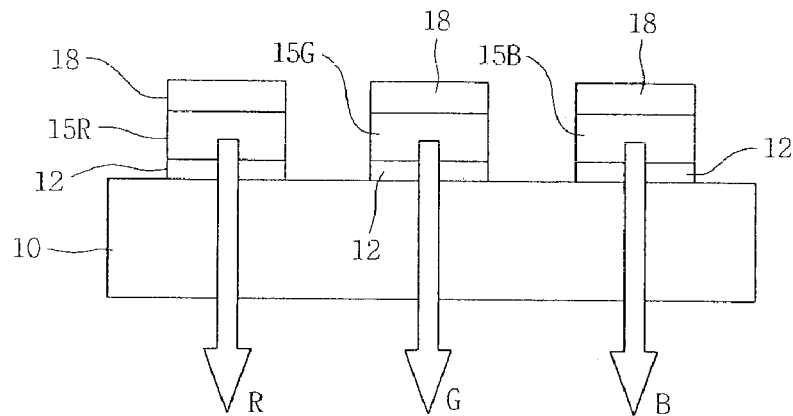
FIGS. 1A to 1C illustrate various implementations of a color image display method in an organic light emitting device.
Figure 1B:
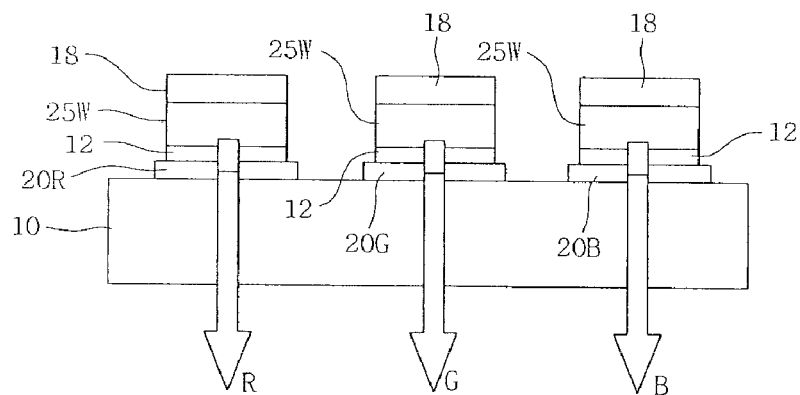
Figure 1C:
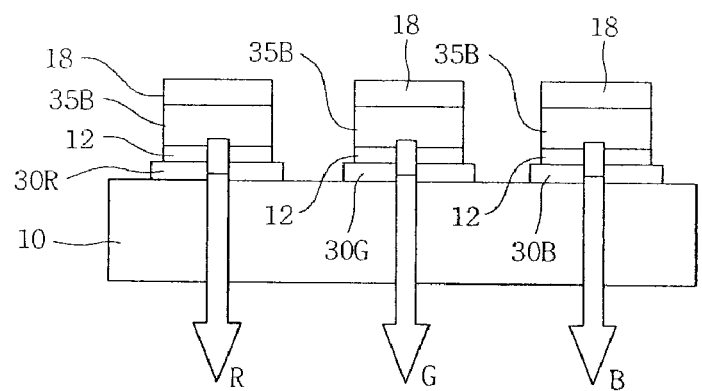

FIGS. 1A to 1C illustrate various implementations of a color image display method in an organic light emitting device. Other implementations may also be used. FIG. 1A illustrates a color image display method in an organic light emitting device that separately includes a red organic emitting layer 15R to emit red light, a green organic emitting layer 15G to emit green light and a blue organic emitting layer 15B to emit blue light. The red, green and blue light produced by the red, green and blue organic emitting layers 15R, 15G and 15B may be mixed to display a color image.

In FIG. 1A, the red, green and blue organic emitting layers 15R, 15G and 15B may each include an electron transporting layer, an emitting layer, a hole transporting layer, and the like. FIG. 1A also shows a substrate 10, an anode electrode 12 and a cathode electrode 18. Different dispositions and configurations of the substrate 10, the anode electrode 12 and the cathode electrode 18 may also be used.

FIG. 1B illustrates a color image display method in an organic light emitting device that includes a white organic emitting layer 25W to emit white light, a red color filter 20R, a green color filter 20G and a blue color filter 20B.

As shown in FIG. 1B, the red color filter 20R, the green color filter 20G and the blue color filter 20B each receive white light produced by the white organic emitting layer 25W and produce red light, green light and blue light, respectively. The red, green and blue light may be mixed to display a color image. And an organic light emitting device may further include a white color filter. So the organic light emitting device may realization various colors by manner of R/G/B or R/G/B/W.

In FIG. 1B, the white organic emitting layer 25W may include an electron transporting layer, an emitting layer, a hole transporting layer, and the like.

FIG. 1C illustrates a color image display method in an organic light emitting device that includes a blue organic emitting layer 35B to emit blue light, a red color change medium 30R, a green color change medium 30G and a blue color change medium 30B.

As shown in FIG. 1C, the red color change medium 30R, the green color change medium 30G and a blue color change medium 30B each receive blue light produced by the blue organic emitting layer 35B and produce red light, green light and blue light, respectively. The red, green and blue light may be mixed to display a color image. In FIG. 1C, the blue organic emitting layer 35B may include an electron transporting layer, an emitting layer, a hole transporting layer, and the like.

Embodiments of the present invention may provide a light emitting device to prevent degradation and damage of a light emitting unit due to contact with an encapsulation unit or a getter, for example.

Embodiments of the present invention may provide a light emitting device that includes a substrate, a light emitting unit formed on the substrate, and an encapsulation unit having a first region corresponding to the light emitting unit and a second region to couple with the substrate (via a sealant). The encapsulation unit at the first region or a part of the encapsulation unit at the first region may have a positive curvature that projects away from the substrate.

The light emitting device may perform top emission or bottom emission. Embodiments of the present invention may be applicable to active displays and passive displays. Although passive devices are described for ease of convenience, embodiments of the present invention may also be provided with respect to an active device that includes a thin film transistor (TFT). The thin film transistor may have a semiconductor layer, a gate electrode, a source electrode and a drain electrode on the substrate.

Figure 2A:
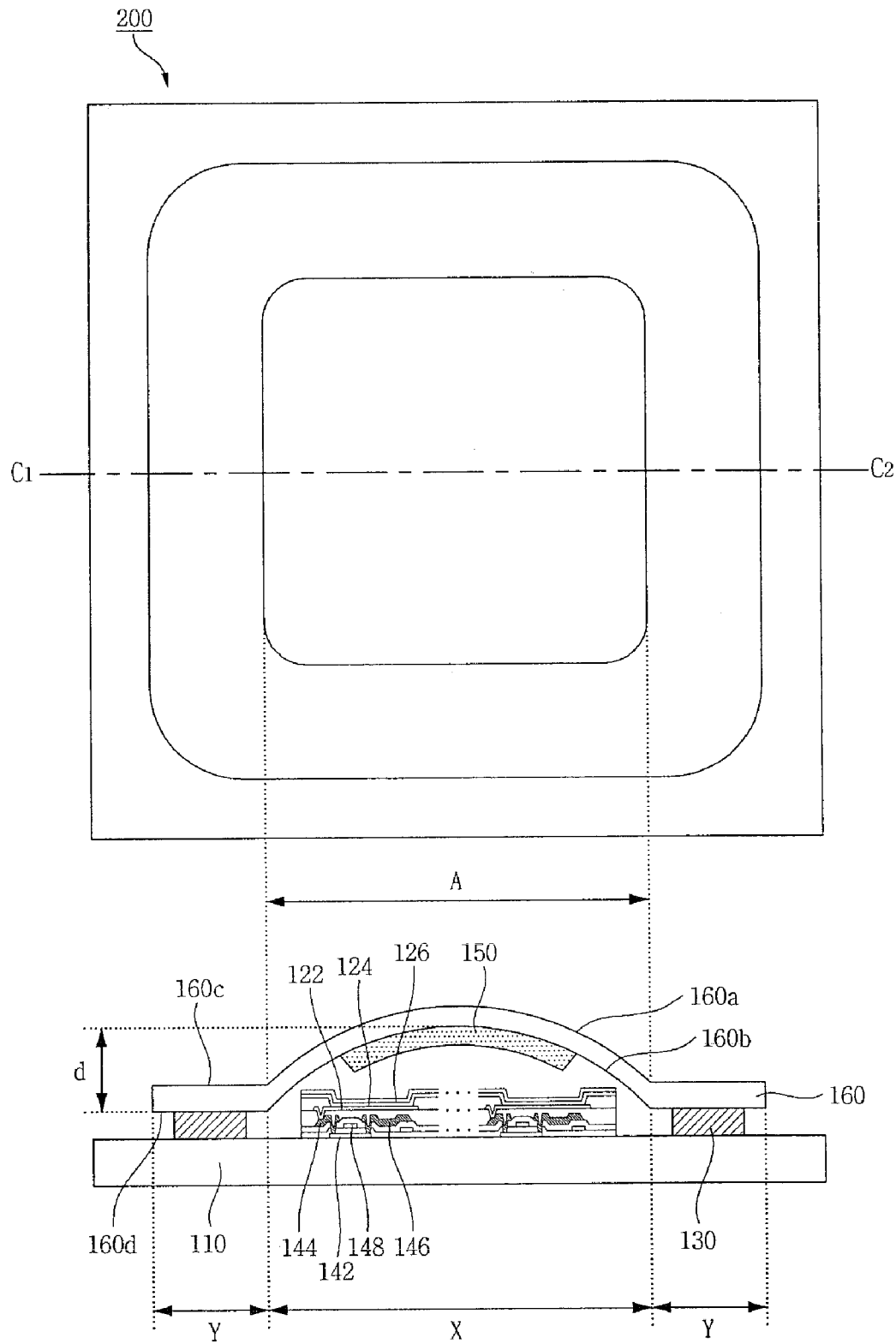
FIGS. 2A to 2C are plan and cross-sectional views illustrating a light emitting device in accordance with example embodiments of the present invention.
Figure 2B:
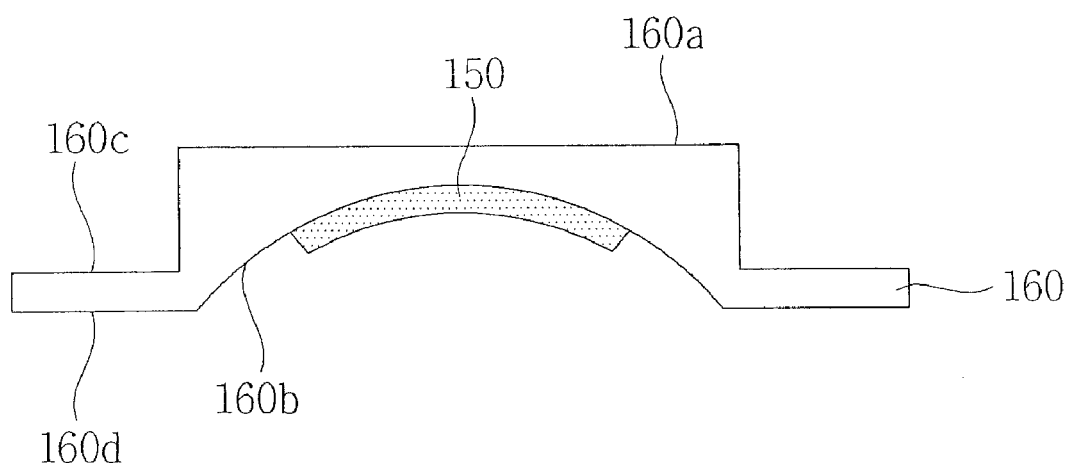
Figure 2C:
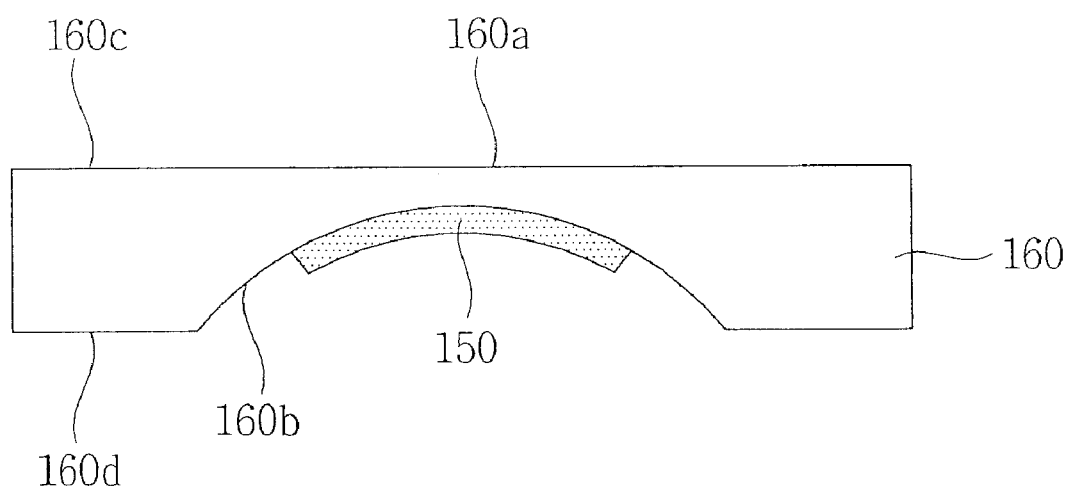

FIGS. 2A to 2C are plan and cross-sectional views illustrating a light emitting device in accordance with example embodiments of the present invention. Other embodiments and configurations are also within the scope of the present invention. The cross sections of FIGS. 2B and 2C are views taken along line C1-C2 of the plan view shown in FIG. 2A.

As shown in FIGS. 2A to 2C, a light emitting device 100 may include a substrate 110, a light emitting unit 120, an encapsulation unit 160 and a getter 150. The substrate 110 may be formed from glass, metal, plastic or the like.

The light emitting unit 120 may be formed on the substrate 110. The light emitting unit 120 may include a first electrode 122, a light emitting layer 124 and a second electrode 126. The light emitting layer 124 including an organic or an inorganic material may be formed over the first electrode 122. The second electrode 126 may be formed on the light emitting layer 124 in such a way to cross the first electrode 122.

A thin film transistor (not shown) having a semiconductor layer, a source electrode, a drain electrode and a gate electrode may also be provided over the substrate 110. The source electrode or the drain electrode of the thin film transistor may be electrically connected to the first electrode 122.

The first electrode 122 may serve as an anode electrode for injecting holes into the light emitting layer 124. The first electrode 122 may be formed of a transparent material having a high work function such as indium tin oxide (ITO) or indium zinc oxide (IZO).

The second electrode 126 may serve as a cathode electrode for injecting electrons into the light emitting layer 124. The second electrode 126 may be formed using aluminum, silver, magnesium and/or an alloy thereof.

The material to form the second electrodes and/or a thickness thereof may vary depending on various factors including size, a light emitting structure, an active or passive type, etc. of the light emitting device.

The encapsulation unit 160 may be formed over the substrate 110 on which the light emitting unit 120 is formed. The encapsulation unit 160 can encapsulate the light emitting unit 120 and the substrate 110 in which various elements are formed. The encapsulation unit 160 may be formed using glass, plastic and/or metal. Other materials may also be used.

The encapsulation unit 160 may include a first region X corresponding to the light emitting unit 120 and a second region Y that aligns with the substrate 110. The second region Y of the encapsulation unit 160 may be aligned with an edge of the substrate 110 using a sealing material, such as a sealant 180 or frit. The second region Y may be a region of the encapsulation unit 160 that couples to the substrate 110 via the sealant 180. The second region Y may also be considered outside the first region X.

The getter 150 may be formed under the first region X of the encapsulation unit 160. The getter 150 may remove oxygen, moisture, etc., that are generated within the device or are externally infiltrated.

A surface having a curvature may have a better durability than a flat surface against deformation due to external force. Therefore, the first region X of the encapsulation unit 160 may have a positive curvature that upwardly projects from the substrate 110 (or projects away from the substrate 110). The first region X of the encapsulation unit 160 may have a concave down shape as shown in FIG. 2A.

If the first region X of the encapsulation unit 160 has a positive curvature with a top point that is far from the substrate 110, then a space between the light emitting unit 120 and the getter 150 may be provided. Although the getter 150 may become thick through absorption of moisture or oxygen, the possibility of contact of the light emitting unit 120 and the getter 150 may decrease due to the increased space.

If the space between the light emitting unit 120 and the getter 150 is increased, then a plurality of getters may be provided. The device may thereby be protected more effectively from moisture and water.

The encapsulation unit 160 may include an upper surface 160a and a lower surface 160b at the first region X. The lower surface 160b may be a surface that faces the substrate 110, and the upper surface 160a may be a surface that faces away from the substrate 110. Both the upper surface 160a and the lower surface 160b may have a positive curvature such as shown in FIG. 2A. The upper surface 160a and the lower surface 160b may both have a same shape (i.e., a curved shape) such as shown in FIG. 2A.

The lower surface 160b may have a positive curvature and the upper surface 160a may be flat and parallel to the substrate 110 such as shown in FIGS. 2B and 2C.

The encapsulation unit 160 may also include an upper surface 160c and a lower surface 160d at the second region Y. The lower surface 160d may be a surface that faces the substrate 110, and the upper surface 160c may be a surface that faces away from the substrate 110. The upper surface 160a at the first region X and the upper surface 160c at the second region Y may both be separately flat and parallel to the substrate 110 such as shown in FIGS. 2B and 2C. The upper surface 160a of the encapsulation unit 160 at the first region X and the upper surface 160c of the encapsulation unit 160 at the second region Y may be formed along a common plane such as shown in FIG. 2C.

A height d may be a distance between a first plane defined by the lower surface 160d of the encapsulation unit 160 at the second region Y and a second plane (parallel to the first plane) defined by a top point of the lower surface 160b of the encapsulation unit 160 at the first region X. The top point may be a point of the lower surface 160b that is furthest from the substrate 110 (or the light emitting unit 120). The height d may range from 10 μm to 100 μm, for example. If the height d is 10 μm or more, degradation of picture quality caused by an interference phenomenon between light emitted from the light emitting device 100 to the encapsulation unit 160 and light incident to the encapsulation unit 160 from outside may be reduced. If the height d is 100 μm or less, thickness of the device may be prevented from becoming too thick.

Stated differently, the encapsulation unit 160 may include a first surface (i.e., the lower surface 160b) at the first region X that faces the substrate 110 and a second surface (i.e., the lower surface 160d) at the second region Y that faces the substrate 110, where the first surface includes a top point that is furthest from the substrate 110. The second surface may define a first plane and the top point may be on a second plane that is parallel to the first plane. A distance between the first plane and the second plane may be within a range of 10 μm to 100 μm.

Figure 3A:
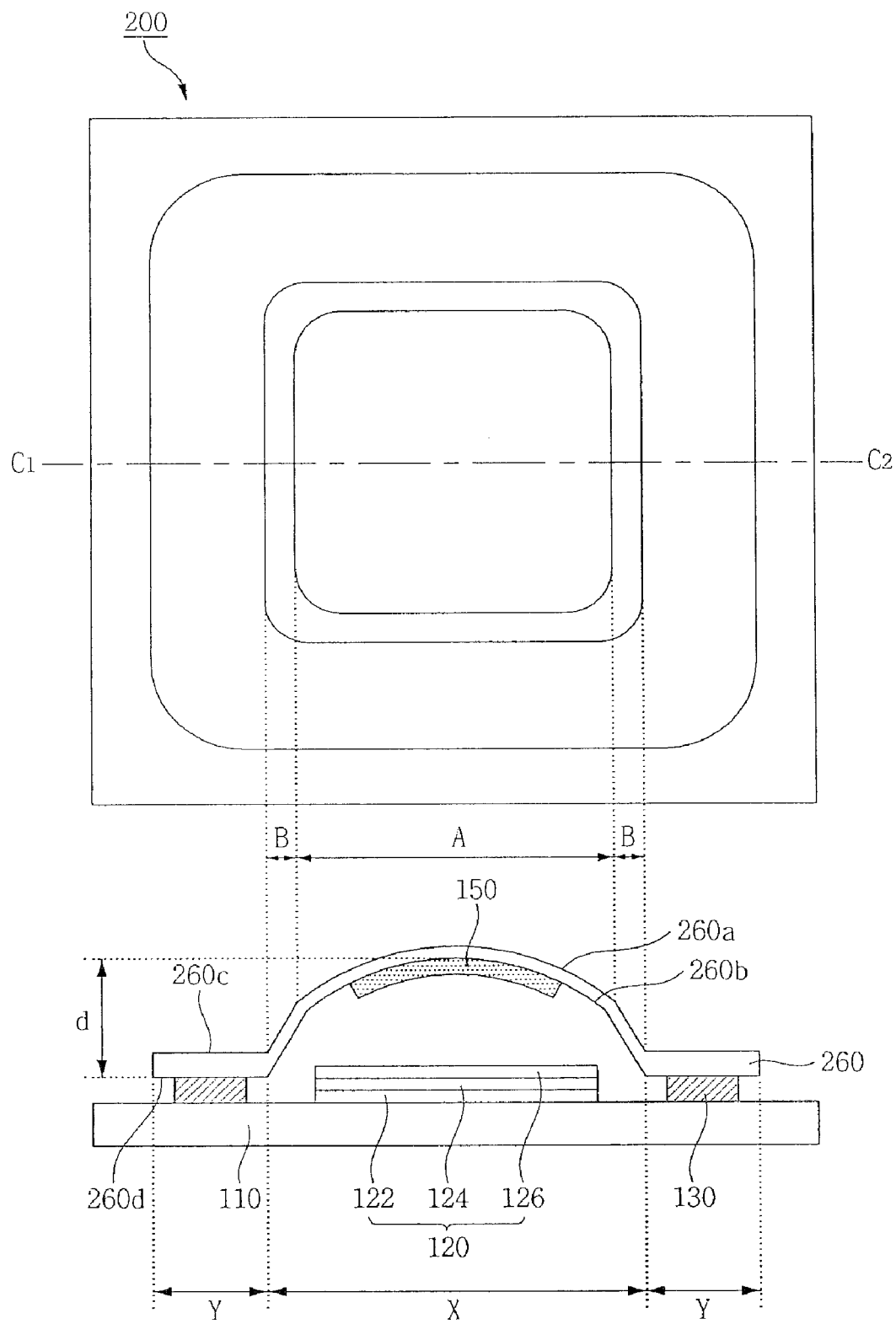
FIGS. 3A to 3C are plan and cross-sectional views illustrating a light emitting device in accordance with example embodiments of the present invention.
Figure 3B:
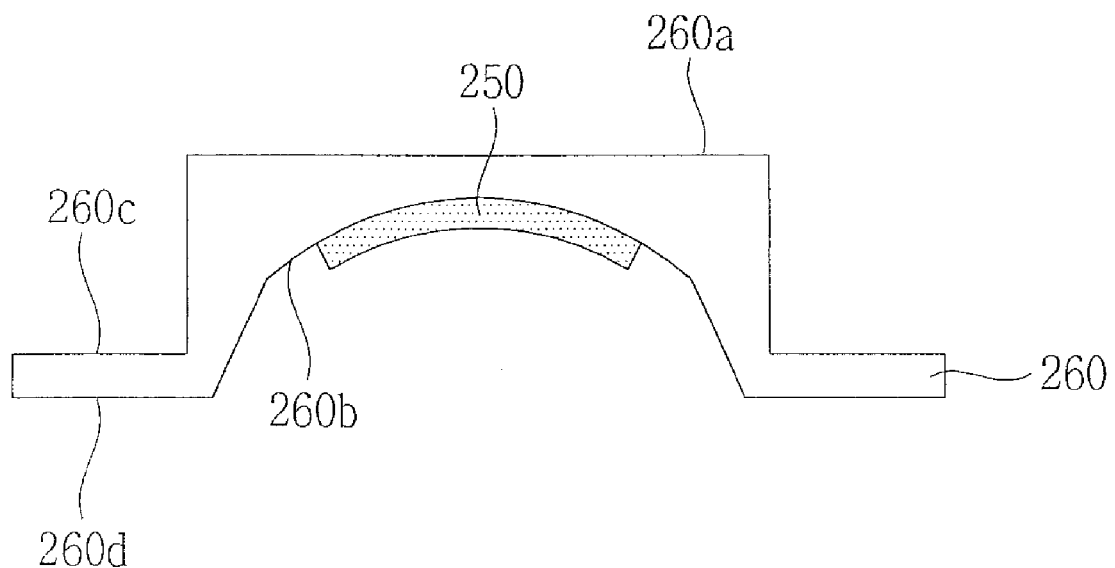
Figure 3C:
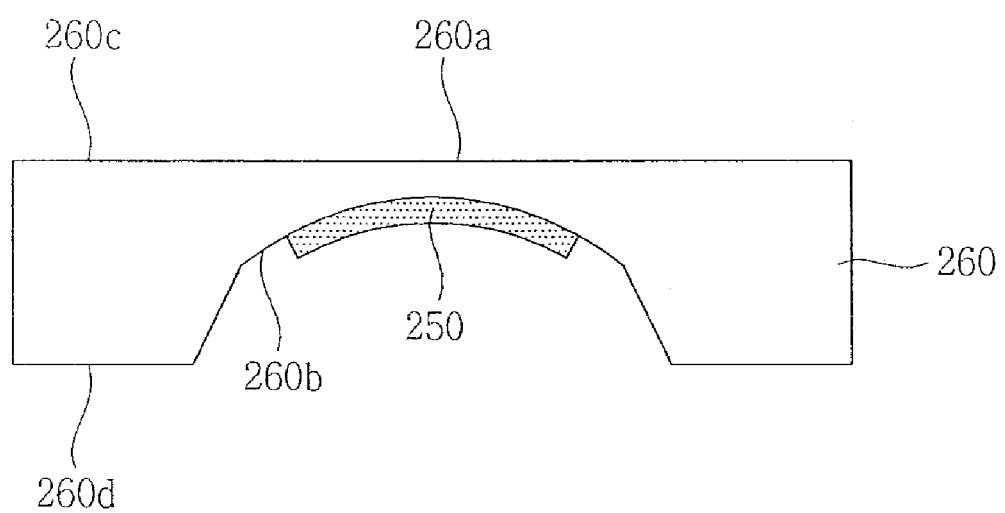

FIGS. 3A to 3C are plan and cross-sectional views illustrating a light emitting device in accordance with example embodiments of the present invention. The cross sections of FIGS. 3B and 3C are views taken along line C1-C2 of the plan view shown in FIG. 3A. Other embodiments and configurations are also within the scope of the present invention.

As shown in FIGS. 3A to 3C, an encapsulation unit 260 of a light emitting device 200 may include the first region X corresponding to the light emitting unit 120 and the second region Y that aligns with the substrate 110. At least one part of the first region X of the encapsulation unit 260 may have a positive curvature that upwardly projects from the substrate 110 (or projects away from the substrate 110). That is, the first region X of the encapsulation unit 260 may have a concave down shape (with respect to the substrate 110), such as shown in FIGS. 3A-3C.

The first region X of the encapsulation unit 260 may include a central area A having a positive curvature and an edge area B having a cross section surface with a flat shape or a straight-line shape (and without having a curvature or any substantial curvature). The edge area B may be provided about the central area A such that the edge area B is adjacent (or about) the second region Y.

A surface having a curvature may have better durability than a flat surface against deformation due to external force. Therefore, the central area A may have a positive curvature that upwardly projects from the substrate 110 (or projects away from the substrate 110).

If the first region X of the encapsulation unit 260 has a positive curvature with a top point that is far above the substrate 110, then a space between a light emitting unit 120 and the getter 150 may be provided. Although the getter 150 may become thick through absorption of moisture or oxygen, the possibility of contact of the light emitting unit 120 and the getter 150 may decrease due to the increased space.

If the space between the light emitting unit 120 and the getter 150 is increased, then a plurality of getters may be provided. The device may thereby be protected more effectively from moisture and water.

The edge area B (of the first region X) may have a cross section surface with a flat shape or a straight-line shape. The edge area B (of the first region X) may extend from (or be defined by) an inner edge (or end) of the second region Y to a region aligned with one end of the light emitting unit 120 formed on the substrate 110 such as shown in FIG. 3A.

The encapsulation unit 260 may include an upper surface 260a and a lower surface 260b at the first region X. The lower surface 260b may be a surface that faces the substrate 110, and the upper surface 260a may be a surface that faces away from the substrate 110. Both the upper surface 260a and the lower surface 260b at the central area A may have a positive curvature such as shown in FIG. 3A. The upper surface 260a and the lower surface 260b may both have a same shape (i.e., a curved shape) such as shown in FIG. 3A.

Further, the upper surface 260a and the lower surface 260b at the edge area B may have a flat shape or a straight-line shape such as shown in FIG. 3A. That is, the upper surface 260a and the lower surface 260b at the edge area B may both have a same shape such as shown in FIG. 3A.

The upper surface 260a at the first region X may have a flat shape that is parallel to the substrate 110 (regardless of the lower surface 260b) such as shown in FIGS. 3B-3C.

The encapsulation unit 260 may also include an upper surface 260c and a lower surface 260d at the second region Y. The lower surface 260d may be a surface that faces the substrate 110, and the upper surface 260c may be a surface that faces away from the substrate 110. The upper surface 260a at the first region X and the upper surface 260c at the second region Y may both be separately flat and parallel to the substrate 110 such as shown in FIGS. 3B-3C. The upper surface 260a of the encapsulation unit 260 at the first region X and the upper surface 260c of the encapsulation unit 260 at the second region Y may be formed along a common plane such as shown in FIG. 3C.

A height d may be a distance between a first plane defined by the lower surface 260d of the encapsulation unit 260 at the second region Y and a second plane (parallel to the first plane) defined by a top point of the lower surface 260b of the encapsulation unit 260 at the first region X. The top point may be a point of the lower surface 260b that is furthest from the substrate 110 (or the light emitting unit 120). The height d may range from 10 μm to 100 μm. If the height d is 10 μm or more, degradation of picture quality caused by an interference phenomenon between light emitted from the light emitting device 200 to the encapsulation unit 260 and light incident to the encapsulation unit 260 from outside may be reduced. If the height d is 100 μm or less, thickness of the device may be prevented from becoming too thick.

Stated differently, the encapsulation unit 260 may include a first surface (i.e., the lower surface 260b) at the first region X that faces the substrate 110 and a second surface (i.e., the lower surface 260d) at the second region Y that faces the substrate 110, where the first surface includes a top point that is furthest from the substrate 110. The second surface may define a first plane and the top point may be on a second plane that is parallel to the first plane. A distance between the first plane and the second plane may be within a range of 10 μm to 100 μm.

Figure 4A:
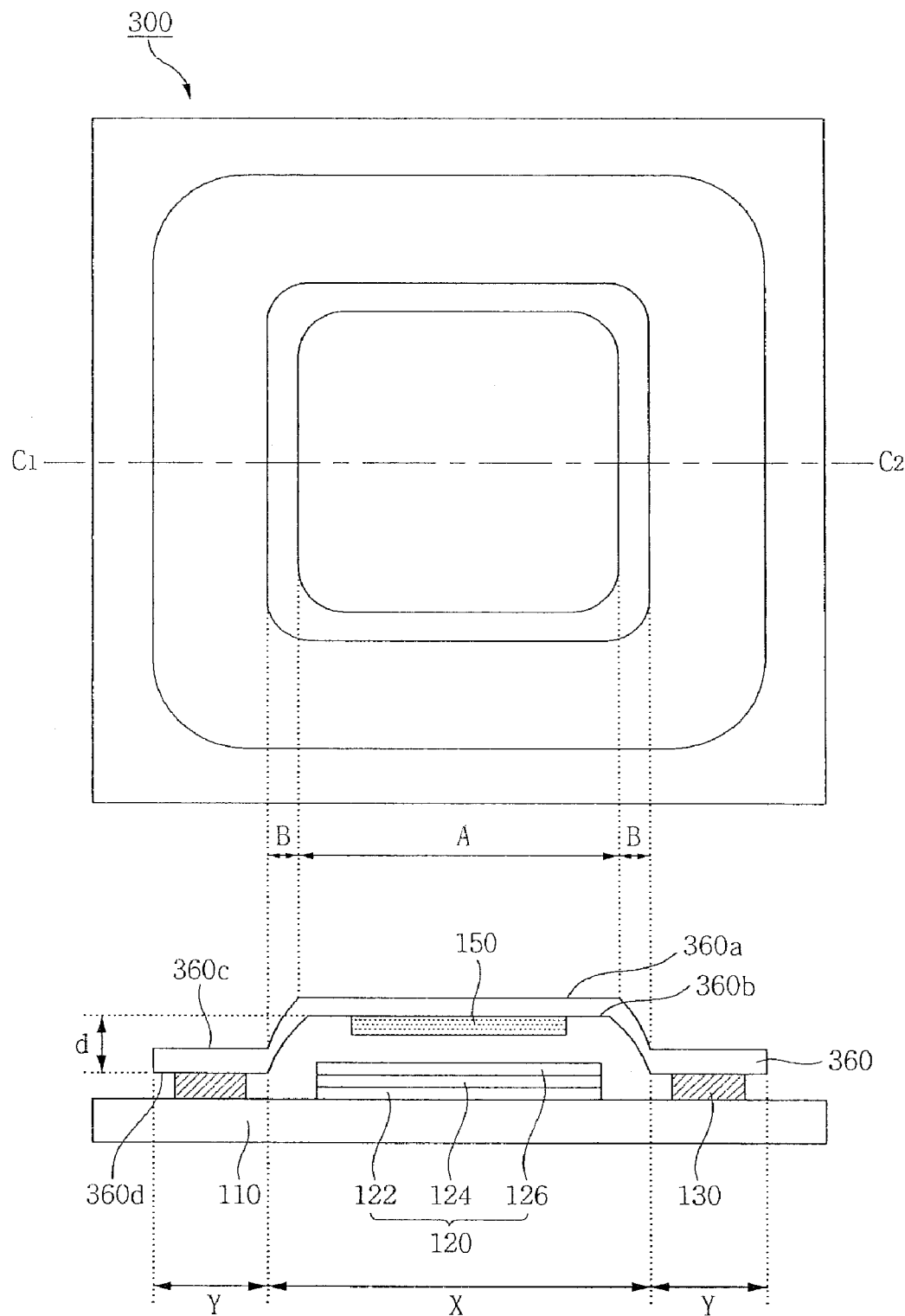
FIGS. 4A to 4C are plan and cross-sectional views illustrating a light emitting device in accordance with example embodiments of the present invention.
Figure 4B:
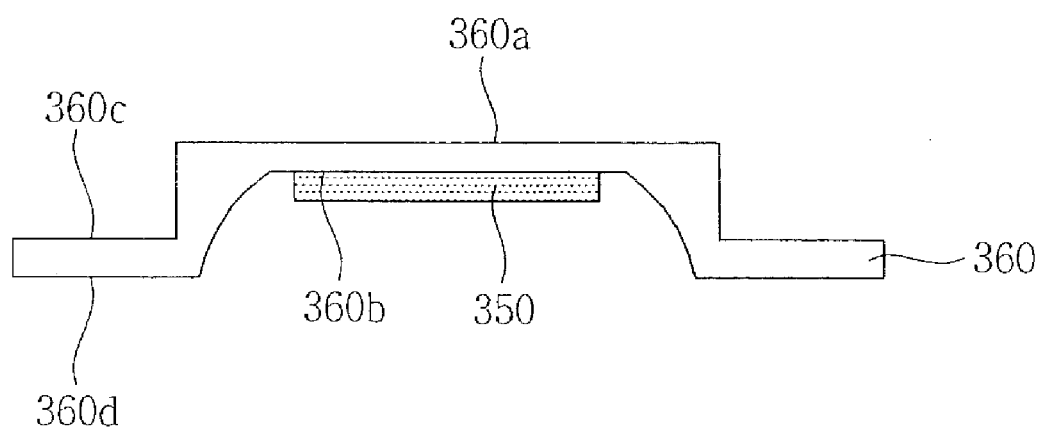
Figure 4C:
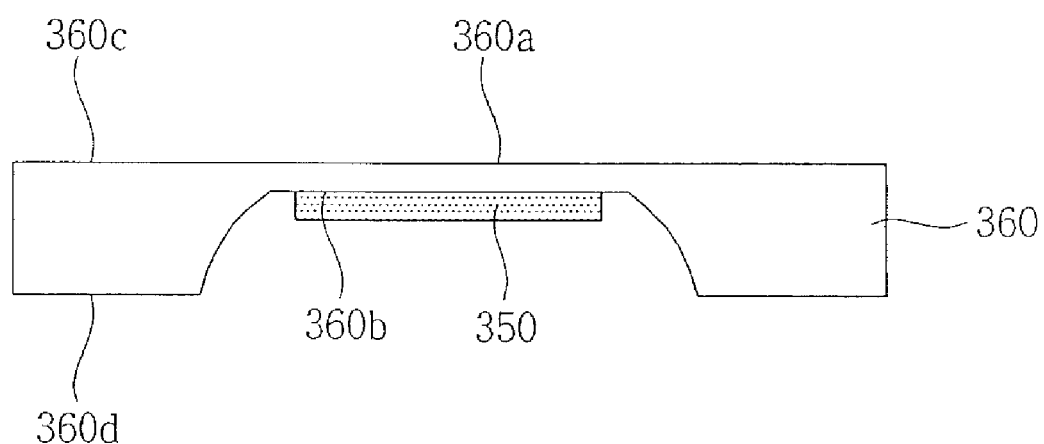

FIGS. 4A to 4C are plan and cross-sectional views illustrating a light emitting device in accordance with example embodiments of the present invention. Other embodiments and configurations are also within the scope of the present invention.

As shown in FIGS. 4A to 4C, an encapsulation unit 360 of a light emitting device 300 may include the first region X corresponding to the light emitting unit 120 and a second region Y that aligns with the substrate 110. At least one part of the first region X of the encapsulation unit 260 may have a positive curvature that upwardly projects from the substrate 110 (or projects away from the substrate 110).

The first region X of the encapsulation unit 360 may include the central area A and the edge area B. The edge area B may have a positive curvature that upwardly projects from the substrate 110 (or projects away from the substrate 110) and the central area A may have a cross section surface with a flat shape or a straight-line shape (and without any curvature or any substantial curvature). The central area A may be parallel to a surface of the substrate 110.

A surface having a curvature may have better durability than a flat surface against deformation due to external force. Therefore, the edge area B may have a positive curvature that upwardly projects from the substrate 110 (or projects away from the substrate 110). The edge area B of the encapsulation unit 360 may have a concave down shape (with respect to the substrate 110) such as shown in FIGS. 4A-4C.

The encapsulation unit 360 may include an upper surface 360a and a lower surface 360b at the first region X. The lower surface 360b may be a surface that faces the substrate 110, and the upper surface 360a may be a surface that faces away from the substrate 110. Both the upper surface 360a and the lower surface 360b at the edge area B may have a positive curvature such as shown in FIG. 4A. The upper surface 360a and the lower surface 360b may both have a same shape (i.e., a curved shape) such as shown in FIG. 4A.

Further, the upper surface 360a and the lower surface 360b at the central area A may have a flat shape or a straight-line shape such as shown in FIGS. 4A-4C. That is, the upper surface 360a and the lower surface 360b at the central area A may both have a same shape such as shown in FIGS. 4A-4C.

The upper surface 360a at the first region X may have a flat shape that is parallel to the substrate 110 (regardless of the lower surface 360b) such as shown in FIGS. 4A-4C.

The encapsulation unit 360 may also include an upper surface 360c and a lower surface 360d at the second region Y. The lower surface 360d may be a surface that faces the substrate 110, and the upper surface 360c may be a surface that faces away from the substrate 110. The upper surface 360a at the first region X and the upper surface 360c at the second region Y may both be separately flat and parallel to the substrate 110 such as shown in FIGS. 4B-4C. The upper surface 360a of the encapsulation unit 360 at the first region X and the upper surface 360c of the encapsulation unit 360 at the second region Y may be formed along a common plane such as shown in FIG. 4C.

A height d may be a distance between a first plane defined by the lower surface 360d of the encapsulation unit 360 at the second region Y and a second plane (parallel to the first plane) defined by a top point of the lower surface 360b of the encapsulation unit 360 at the first region X. The top point may be a point of the lower surface 360b that is furthest from the substrate 110 (or the light emitting unit 120). The height d may range from 10 μm to 100 μm. If the height d is 10 μm or more, degradation of picture quality caused by an interference phenomenon between light emitted from the light emitting device 300 to the encapsulation unit 360 and light incident to the encapsulation unit 360 from outside may be reduced. If the height d is 00 μm or less, thickness of the device may be prevented from becoming too thick.

Stated differently, the encapsulation unit 360 may include a first surface (i.e., the lower surface 360b) at the first region X that faces the substrate 110 and a second surface (i.e., the lower surface 360d) at the second region Y that faces the substrate 110, where the first surface includes a top point that is furthest from the substrate 110. The second surface may define a first plane and the top point may be on a second plane that is parallel to the first plane. A distance between the first plane and the second plane may be within a range of 10 μm to 100 μm.

As described above, an encapsulation unit of a first region or a part of an encapsulation unit may have a curvature. However, the encapsulation unit is not limited to the above shape. The light emitting device may also have two or more curvatures.

The light emitting unit 120, as discussed above, may include a plurality of unit pixels with each unit pixel including a plurality of subpixels. For example, FIGS. 1A-1C show different arrangements of red, blue, green and white light emitting layers to produce various combinations of red, blue and green light. Other combinations and/or colors may be used. The light emitting layers of the subpixels may include phosphorescence material and/or fluorescence material. The arrangements of FIGS. 1A-1C may be provided within any of the embodiments of the present invention and/or displays associated with each of FIGS. 2A-4C.

In a case where the subpixel emits red light, the emitting layer of the subpixel may include a host material including carbazole biphenyl (CBP) or 1,3-bis(carbazol-9-yl (mCP), and may be formed of a phosphorescence material including a dopant material including P QIr(acac)(bis(1-phenylisoquinoline)acetylacetonate iridium), PQIr(acac)(bis(1-phenylquinoline)acetylacetonate iridium), PQIr(tris(1-phenylquinoline)iridium), or PtOEP(octaethylporphyrin platinum) or a fluorescence material including PBD:Eu (DBM)3(Phen) or Perylene.

In the case where the subpixel emits green light, the emitting layer may include a host material including CBP or mCP, and may be formed of a phosphorescence material including a dopant material including Ir(ppy)3(fac tris(2-phenylpyridine)iridium) or a fluorescence material including Alq3(tris (8-hydroxyquinolino)aluminum).

In the case where the subpixel emits blue light, the emitting layer may includes a host material including CBP or mCP, and may be formed of a phosphorescence material including a dopant material including (4,6-F2ppy)2Irpic or a fluorescence material including spiro-DPVBi, spiro-6P, distyrylbenzene (DSB), distyryl-arylene (DSA), PFO-based polymers, PPV-based polymers, or a combination thereof.

And a difference between driving voltages, e.g., the power voltages VDD and Vss of the light emitting device may change depending on the size of the light emitting device 100 (or 200 or 300) and a driving manner. A magnitude of the driving voltage is shown in the following Tables 1 and 2. Table 1 indicates a driving voltage magnitude in case of a digital driving manner, and Table 2 indicates a driving voltage magnitude in case of an analog driving manner.

TABLE 1

| Size (S) of display panel | VDD-Vss (R) | VDD-Vss (G) | VDD-Vss (B) |
| --- | --- | --- | --- |
| S < 3 inches | 3.5-10 (V) | 3.5-10 (V) | 3.5-12 (V) |
| 3 inches < S < 20 inches | 5-15 (V) | 5-15 (V) | 5-20 (V) |
| 20 inches < S | 5-20 (V) | 5-20 (V) | 5-25 (V) |

TABLE 2

| Size (S) of display panel | VDD-Vss (R, G, B) |
| --- | --- |
| S < 3 inches | 4~20 (V) |
| 3 inches < S < 20 inches | 5~25 (V) |
| 20 inches < S | 5~30 (V) |

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a substrate;
a light emitting unit on the substrate; and
an encapsulation unit having a first region corresponding to the light emitting unit and a second region outside of the first region to couple with the substrate via a sealant, the first region including a central area and an edge area about the central area, wherein the central area of the first region has a flat shape and the edge area of the first region has a positive curvature that projects away from the substrate, wherein the second region is coupled at a periphery of the substrate, and a height between a first plane defined by a lower surface of the encapsulation unit at the second region and a second plane defined by a lower surface of the encapsulation unit at the central area is 10 μm to 100 μm, wherein the first region and the second region have a same thickness.

2. The light emitting device of claim 1, wherein a lower surface of the encapsulation unit at the central area has the flat shape and a lower surface of the encapsulation unit at the edge area has the positive curvature.

3. The light emitting device of claim 2, wherein the lower surface of the encapsulation unit at the central area is parallel to a surface of the substrate.

4. The light emitting device of claim 1, wherein an upper surface of the encapsulation unit at the central area has the flat shape and an upper surface of the encapsulation unit at the edge area has the curvature.

5. The light emitting device of claim 4, wherein the upper surface of the encapsulation unit at the central area is parallel to a surface of the substrate.

6. The light emitting device of claim 1, wherein a lower surface of the encapsulation unit at the central area has the flat shape and a lower surface of the encapsulation unit at the edge area has the positive curvature, and an upper surface of the encapsulation unit at the central area has the flat shape and an upper surface of the encapsulation unit at the edge area has the positive curvature.

7. The light emitting device of claim 6, wherein the lower and upper surfaces of the encapsulation unit at the central area are parallel to a surface of the substrate.

8. The light emitting device of claim 1, further comprising a thin film transistor including a semiconductor layer, a gate electrode, a source electrode and a drain electrode on the substrate.

9. The light emitting device of claim 1, wherein the encapsulation unit comprises glass, plastic or metal.

10. The light emitting device of claim 1, wherein the light emitting unit includes a plurality of sub pixels, each of the sub pixels comprises a first electrode, a light emitting layer and a second electrode provided on the first electrode, and at least one of the plurality of sub pixels includes a phosphorescence material.

11. The light emitting device of claim 1, further comprising a getter provided between the first region of the encapsulation unit and the light emitting unit.

12. A light emitting device comprising:
a substrate;
a light emitting unit on the substrate; and
an encapsulation unit having a first region corresponding to the light emitting unit and a second region outside of the first region to couple with the substrate via a sealant, the first region including a central area and an edge area about the central area, wherein a lower surface of the encapsulation unit at the central area has a flat shape and a lower surface of the encapsulation unit at the edge area has a positive curvature that projects away from the substrate, wherein the second region is coupled at a periphery of the substrate, and a height between a first plane defined by a lower surface of the encapsulation unit at the second region and a second plane defined by the lower surface of the encapsulation unit at the central area is 10 μm to 100 μm, wherein an upper surface of the encapsulation unit at the first region has a flat shape.

13. The light emitting device of claim 12, wherein the upper surface of the encapsulation unit at the first region and an upper surface of the encapsulation unit at the second region are parallel to a surface of the substrate.

14. The light emitting device of claim 13, wherein the upper surfaces of the encapsulation unit at the first and second regions are on a same plane.

15. The light emitting device of claim 13, wherein the upper surfaces of the encapsulation unit at the first and second regions are on different planes.

16. The light emitting device of claim 12, wherein the lower surface of the encapsulation unit at the central area is parallel to a surface of the substrate.

17. The light emitting device of claim 12, further comprising a thin film transistor including a semiconductor layer, a gate electrode, a source electrode and a drain electrode on the substrate.

18. The light emitting device of claim 12, wherein the encapsulation unit comprises glass, plastic or metal.

19. The light emitting device of claim 12, wherein the light emitting unit includes a plurality of sub pixels, each of the sub pixels comprises a first electrode, a light emitting layer and a second electrode provided on the first electrode, and at least one of the plurality of sub pixels includes a phosphorescence material.

20. The light emitting device of claim 12, further comprising a getter provided between the first region of the encapsulation unit and the light emitting unit.

* * * * *